United States Patent
Braceras et al.

(10) Patent No.: US 9,570,155 B2
(45) Date of Patent: Feb. 14, 2017

(54) CIRCUIT TO IMPROVE SRAM STABILITY

(71) Applicant: INTERNATIONAL BUSINESS MACHINES CORPORATION, Armonk, NY (US)

(72) Inventors: George M. Braceras, Essex Junction, VT (US); Venkatraghavan Bringivijayaraghavan, Tamilnadu (IN); Krishnan S. Rengarajan, Bangalore (IN); Arjun Sankar, Kerala (IN); Sreenivasula R. Dhani Reddy, Proddatur (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/734,525

(22) Filed: Jun. 9, 2015

(65) Prior Publication Data
US 2016/0365139 A1  Dec. 15, 2016

(51) Int. Cl.
*G11C 11/419* (2006.01)

(52) U.S. Cl.
CPC ................... *G11C 11/419* (2013.01)

(58) Field of Classification Search
CPC .................................. G11C 11/419
USPC ....................................... 365/154
See application file for complete search history.

(56) References Cited

U.S. PATENT DOCUMENTS

| | | | | |
|---|---|---|---|---|
| 5,875,139 A * | 2/1999 | Semi | ........................ | G11C 7/12 365/189.06 |
| 6,798,688 B2 * | 9/2004 | Joshi | ..................... | G11C 11/413 365/154 |
| 7,436,721 B2 | 10/2008 | Lehmann et al. | | |
| 7,515,489 B2 * | 4/2009 | Wong | ...................... | G11C 5/147 365/156 |
| 7,643,357 B2 * | 1/2010 | Braceras | ............... | G11C 11/417 365/154 |
| 8,233,342 B2 | 7/2012 | Adams et al. | | |
| 2003/0189849 A1 * | 10/2003 | Khellah | ................ | G11C 11/417 365/200 |
| 2006/0274587 A1 * | 12/2006 | Houston | ............... | G11C 11/413 365/203 |
| 2009/0034345 A1 | 2/2009 | Chan et al. | | |

(Continued)

FOREIGN PATENT DOCUMENTS

| WO | 2008097782 | 8/2008 |
|---|---|---|
| WO | 2009009564 | 1/2009 |

OTHER PUBLICATIONS

Wann et al., "SRAM Cell Design for Stability Methodology", IEEE VLSI-TSA International Symposium, 2005, pp. 21-22.

(Continued)

*Primary Examiner* — Anthan Tran
*Assistant Examiner* — Mushfique Siddique
(74) *Attorney, Agent, or Firm* — Anthony Canale; Andrew M. Calderon; Roberts Mlotkowski Safran Cole & Calderon, P.C.

(57) ABSTRACT

Approaches for stability of cells in a Static Random Access Memory (SRAM) array are provided. A circuit includes a precharging circuit configured to precharge bitlines of a Static Random Access Memory (SRAM) array to a first voltage potential for a non-read operation and to a second voltage potential for a read operation. The first voltage potential is different than the second voltage potential.

3 Claims, 5 Drawing Sheets

(56) References Cited

U.S. PATENT DOCUMENTS

| | | | |
|---|---|---|---|
| 2009/0135663 A1* | 5/2009 | van Winkelhoff | G11C 11/419 365/189.16 |
| 2009/0235171 A1* | 9/2009 | Adams | G11C 7/1096 715/723 |
| 2011/0255361 A1* | 10/2011 | Russell | G11C 7/1075 365/230.05 |
| 2012/0014172 A1* | 1/2012 | Jung | G11C 11/413 365/154 |
| 2012/0213023 A1* | 8/2012 | Dawson | G11C 7/1048 365/203 |
| 2013/0064007 A1 | 3/2013 | Deng | |
| 2013/0343135 A1* | 12/2013 | Baeck | G11C 7/12 365/189.11 |
| 2014/0036610 A1* | 2/2014 | Ramamurthy | G11C 7/12 365/203 |
| 2014/0078819 A1 | 3/2014 | Deng et al. | |
| 2016/0012881 A1* | 1/2016 | Kuo | G11C 11/419 365/156 |
| 2016/0111142 A1* | 4/2016 | Yang | G11C 11/417 365/154 |

OTHER PUBLICATIONS

Pilo et al., "A 64Mb SRAM in 32nm High-k metal-gate SOI technology with 0.7V operation enabled by stability, write-ability and read-ability enhancements", IEEE International Conference, 2011, abstract only, 1 page.

Alorda et al., "Static-Noise Margin Analysis during Read Operation of 6T SRAM Cells", DCIS Proceedings, 2009, 6 pages.

* cited by examiner

CIRCUIT TO IMPROVE SRAM STABILITY

FIELD OF THE INVENTION

The invention relates to semiconductor devices and, more particularly, to static random access memory (SRAM) devices and methods of manufacturing the same.

BACKGROUND

Static random access memory (SRAM) is a type of semiconductor memory used in many integrated circuit applications, from embedded memory (e.g., as cache memory and register files) in general purpose processors and application specific integrated circuits to external memories. SRAM is a desirable type of memory due to its high-speed, low power consumption, and simple operation. Unlike dynamic random access memory (DRAM), SRAM does not need to be regularly refreshed to retain the stored data, and its design is generally straightforward.

A typical SRAM cell includes a pair of cross-coupled inverters that hold a desired data bit value (i.e., either a 1 or a 0) and the complement of that value. While SRAM is a desirable type of memory, it is known that if not properly designed and fabricated, an SRAM cell can become unstable when accessed, at which point the held bit value is upset, i.e., switches. Moreover, the stability of an SRAM cell is in full conflict with the writeability of the cell with respect to the strengths of the N-type devices (transistors) and P-type devices (transistors) within the cell. Readability of an SRAM cell is the ability to drive a required signal magnitude onto the bitline within a specified time allocated for signal development, and is a function of the read current of the cell. There tends to be a performance conflict between stability and readability/writeability in such cells. Techniques that increase stability typically have the adverse effect of decreasing readability/writeability. Conversely, techniques that increase readability/writeability typically have the adverse effect of decreasing stability.

SRAM stability is a measure of how much "noise" the cell can tolerate before it loses its data. Stability disturb is a condition that can occur during both read and write operations of an SRAM cell. A particular technique to improve stability is lowering the world line potential during a write operation; however, such lowering of the word line potential negatively affects the writeability.

SUMMARY

In a first aspect of the invention, there is a circuit including a precharging circuit configured to precharge bitlines of a Static Random Access Memory (SRAM) array to a first voltage potential for a non-read operation and to a second voltage potential for a read operation. The first voltage potential is different than the second voltage potential.

In another aspect of the invention, there is a circuit including a plurality of bitline pairs associated with respective columns of a Static Random Access Memory (SRAM) array. The circuit also includes a precharging circuit configured to precharge each respective one of the plurality of bitline pairs, independent of other ones of the plurality of bitline pairs, to one of a first voltage potential and a second voltage potential. The first voltage potential is different than the second voltage potential.

In another aspect of the invention, there is a method including precharging bitline pairs of a Static Random Access Memory (SRAM) array to a first voltage potential for a non-read operation. The method also includes precharging at least one of the bitline pairs to a second voltage potential for a read operation, wherein the first voltage potential is less than the second voltage potential.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and, more particularly, to static random access memory (SRAM) devices and methods of manufacturing the same. According to aspects of the invention, bitlines in an SRAM array are precharged to different voltage potential levels for read and non-read operations. In an embodiment, all the bitlines are precharged to a first voltage for non-read operations (e.g. such as a write operation or a no-operation, apart from deepsleep), and to a second voltage for a read operation, where the first voltage is less than the second voltage. This improves the stability of cells in half selected columns during writes. In another embodiment, the level of precharge is individually controllable for respective each pair of bitlines. For a read operation, the bitlines of half-selected columns are charged to the first level and concurrently the bitlines of the accessed column are precharged to the second level. For a non-read operation, all the bitlines are precharged to the first level. This improves the stability of cells in half selected columns during both reads and writes. In this manner, implementations of the invention improve stability of cells in an SRAM array.

Figure 1:
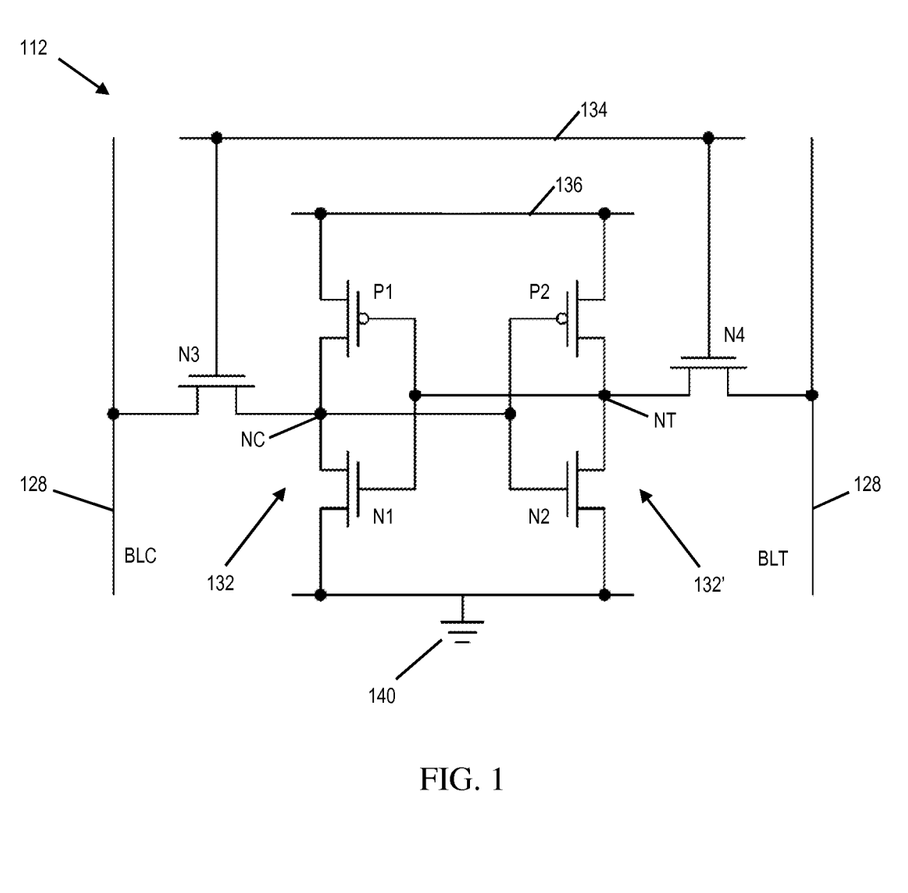
FIG. 1 depicts an SRAM cell.

FIG. 1 depicts an exemplary 6T SRAM cell 112 that may be included in an array. Cell 112 includes a pair of cross-coupled inverters 132, 132' each formed by one of a pair p-type load (or pull-up) transistors P1, P2 electrically connected to a voltage source line 136 and a corresponding one of a pair of n-type drive (or pull-down) transistors N1, N2 electrically connected to a voltage sink line 140, e.g., VSS or ground. Together, cross-coupled inverters 132, 132' form a latch circuit that is capable of storing a single data bit. Cell 112 has two stable states used to denote a "1" bit and a "0" bit, respectively, on internal "storage" nodes NC, NT. Two additional n-type transistors N3, N4, called "access" or "pass-gate" transistors, electrically connect cross-coupled inverters 132, 132' to corresponding respective ones of bit lines BLC, BLT (128) and are controlled by a corresponding wordline WL (134).

In operation, the bit lines BLT, BLC are typically precharged to a high voltage (at or near power supply voltage), and are equalized to the same voltage at the beginning of both read and write cycles, after which the bit lines BLT, BLC then float at that precharged voltage. To access cell 112 for a read operation, the word line WL is then energized, turning on pass transistors N3, N4, and connecting storage nodes NT, NC to the then-floating precharged bit lines BLT, BLC. The differential voltage developed on bit lines BLT, BLC is then sensed and amplified by a sense amplifier. In a write operation, typical modern SRAM memories include write circuitry that pulls one of then-floating precharged bit lines BLT or BLC low (i.e., to a voltage at or near ground voltage), depending on the data state to be written. Upon word line WL then being energized, the low level bit line BLT (or BLC) will pull down its associated storage node NT (or NC), causing the cross-coupled inverters of addressed cell 112 to latch in the desired state.

Device variability can cause read and write failures, particularly in memory cells constructed with sub-micron minimum feature size transistors. A write failure occurs when an addressed SRAM cell does not change its stored state when written with the opposite data state. Typically, this failure has been observed to be due to the inability of write circuitry to pull down the storage node currently latched to a high voltage. For example, in an attempt to write a low logic level to storage node NC, if bit line BLC is unable to sufficiently discharge storage node NC to trip the inverter 132' composed of transistors P2 and N2, cell 112 may not latch to the desired data state. Cell stability failures are the converse of write failures meaning that a write failure occurs when a cell fails to change its state when the change is intended, while a cell stability failure occurs when a cell changes its state when the change is not intended.

Figure 2:
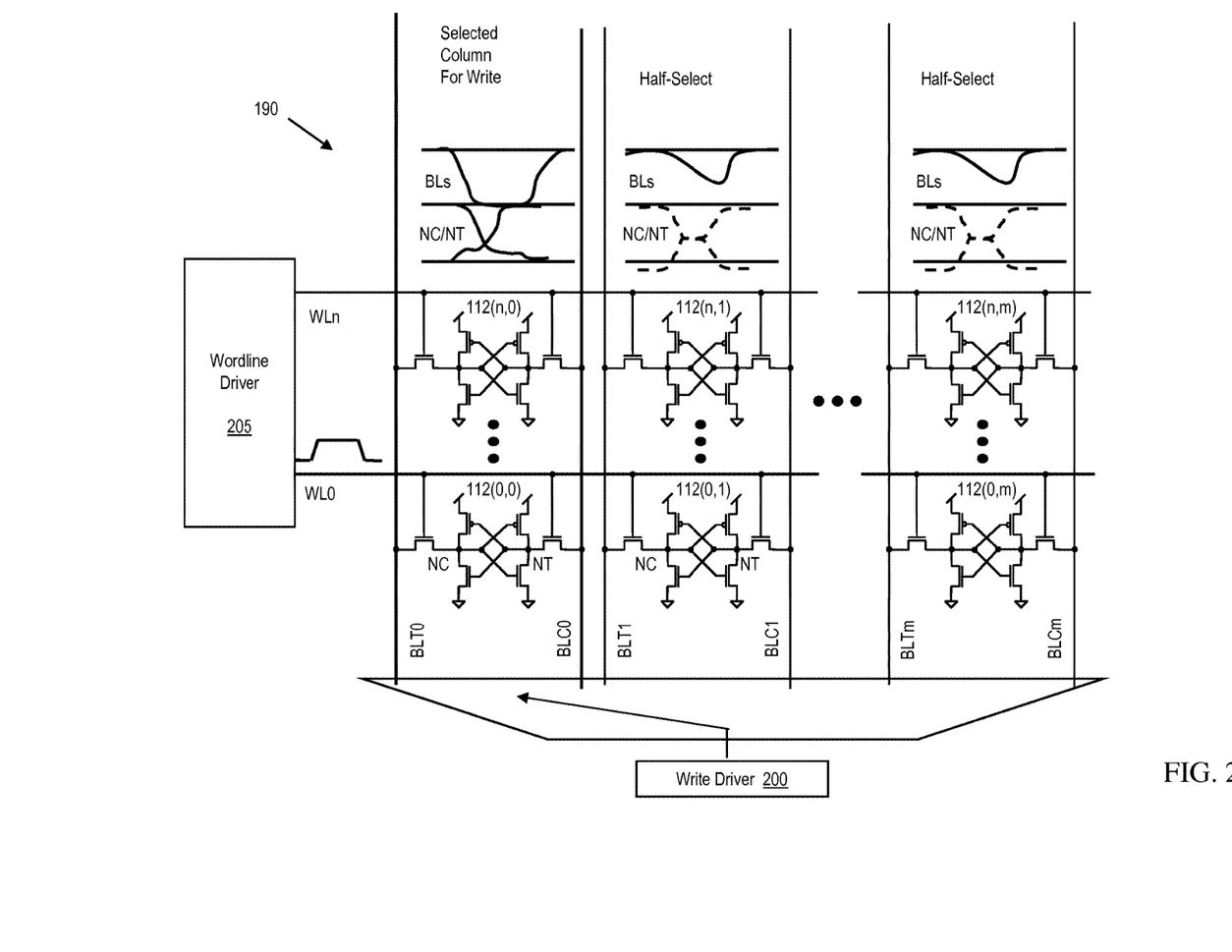
FIG. 2 depicts an SRAM array.

FIG. 2 shows an exemplary array 190 of SRAM cells (each of which may be similar to cell 112) and an associated write driver 200 and wordline driver 205. The cells of the array 190 are arranged in "n" rows and "m" columns where "n" and "m" may be any desired integers. Each cell in a particular row is operatively connected to a common wordline for that row. For example, cells 112(0,0), 112(0,1), . . . , 112(0,m) are connected to wordline WL0. Each cell in a particular column is operatively connected to a pair of common bitlines for that column. For example, cells 112(0,0), . . . , 112(n,0) are connected to bitlines BLC0 and BLT0. To perform a write operation on a selected cell, e.g., cell 112(0,0), the wordline driver 205 drives the voltage on the cell's wordline (e.g., WL0) to a high level, and the write driver 200 drives the voltage on one of the bitlines of the cell's column (e.g., BLT0 or BLC0) to a low level from a precharged high level. The row containing the particular cell is referred to as the selected row, and the column containing the particular cell is referred to as the accessed column. The other cells in the selected row are referred to as half-selected since their wordline is energized while their respective bitlines remain floating. The half-selected cells are particularly vulnerable to the stability disturb condition during the write operation to the selected cell. The stability disturb can upset the stored data state of the half-selected cells, for example causing a false write of data to one or more of the half-selected cells.

Figure 3:
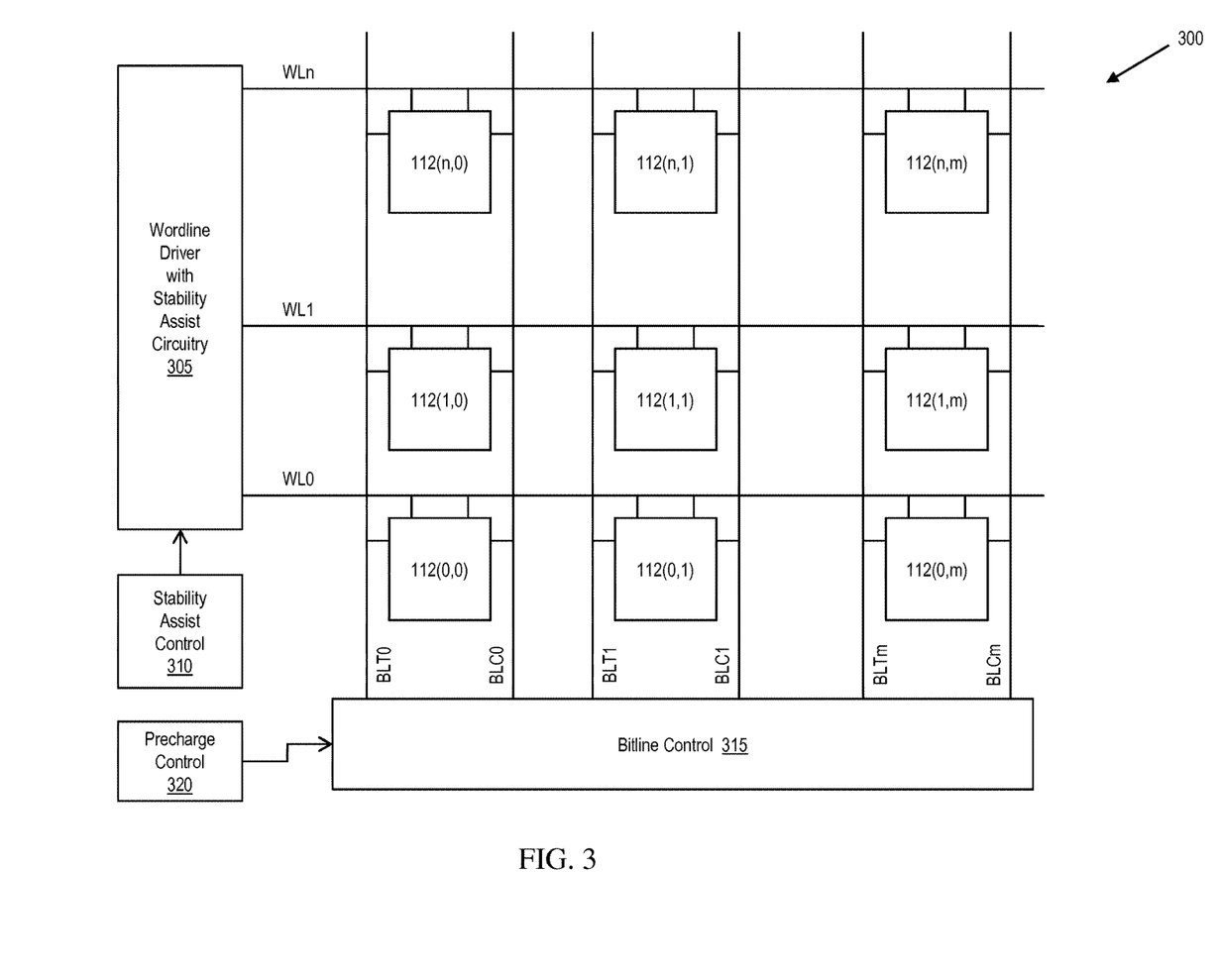
FIG. 3 shows an array with stability assist and precharge control in accordance with aspects of the invention.

FIG. 3 shows an array with stability assist and precharge control in accordance with aspects of the invention. FIG. 3 shows a portion of an SRAM array 300 including a number of cells 112(n,m) arranged in "n" rows and "m" columns where "n" and "m" are any desired integers. Each cell 112(n,m) may be similar to cell 112 shown in FIG. 1. A wordline driver 305 is connected to each wordline (WL0, WL1, . . . , WLn) of the array 300 and includes circuitry for controlling the voltage on each wordline.

The wordline driver 305 may include stability assist circuitry that is configured to apply one of a plurality of stability assist settings (i.e., discrete levels of voltage reduction) to the wordline voltage during a write operation to a selected cell in the selected row. A stability assist control 310 may be connected to the wordline driver 305 and include circuitry that controls the level of stability assist applied to the selected wordline based on a read or write operation. For example, to perform a write operation on a selected cell in the row connected to the wordline WLn, a selection circuit turns on a pull up device (e.g., transistor) that pulls the voltage of the wordline up to the high voltage supply level, e.g., VCS. To improve the stability of the half selected cells connected to the wordline WLn during the write operation to the selected cell, the voltage of the wordline WLn may be decreased slightly from the full VCS level. To achieve different levels of reduction of the voltage of the wordline WLn, a number of pull down devices (e.g. two pull down transistors) are connected between the wordline WLn and the low voltage supply level, e.g., VSS. The pull down devices have different strengths relative to one another and are selectively turned ON/OFF by the selection circuit to pull down the voltage of the wordline from the VCS level, i.e., to apply different levels of stability assist.

Still referring to FIG. 3, a bitline control 315 is connected to the two bitlines of each column (e.g., BLT0, BLC0, BLT1, BLC1, BLTm, BLCm) and includes circuitry for controlling the voltage on each bitline. In embodiments, the bitline control 315 includes circuitry that is configured to selectively precharge the bitlines prior to read and write operations.

With continued reference to FIG. 3, a precharge control 320 is connected to the bitline control 315. In embodiments, the precharge control 320 includes circuitry that controls the precharging of the bitlines to one of plural different voltage potentials prior to read or non-read operations. As used herein, a non-read operation is a write operation or a no-operation (NOP), apart from deepsleep mode. According to aspects of the invention, the precharge control 320 provides a control signal that causes the bitlines to be precharged to a first voltage potential prior to a non-read operation and to a second voltage potential prior to a read operation of the selected SRAM cell. In embodiments, the first voltage potential is less than the second voltage potential. In a particular exemplary embodiment, the second voltage potential is the high voltage supply level, e.g., VCS, and the first voltage potential is a predetermined level less than VCS, e.g., VCS minus Vdrop where Vdrop is defined by the circuit elements. Charging the bitlines to less than the full VCS level in accordance with aspects of the invention improves the stability of the half-selected cells during a write operation to the selected cell. By improving the stability of the half-selected cells in this manner, implementations of the invention permit using a relatively higher wordline potential during the write operation to improve the writeability to the selected cell.

Figure 4:
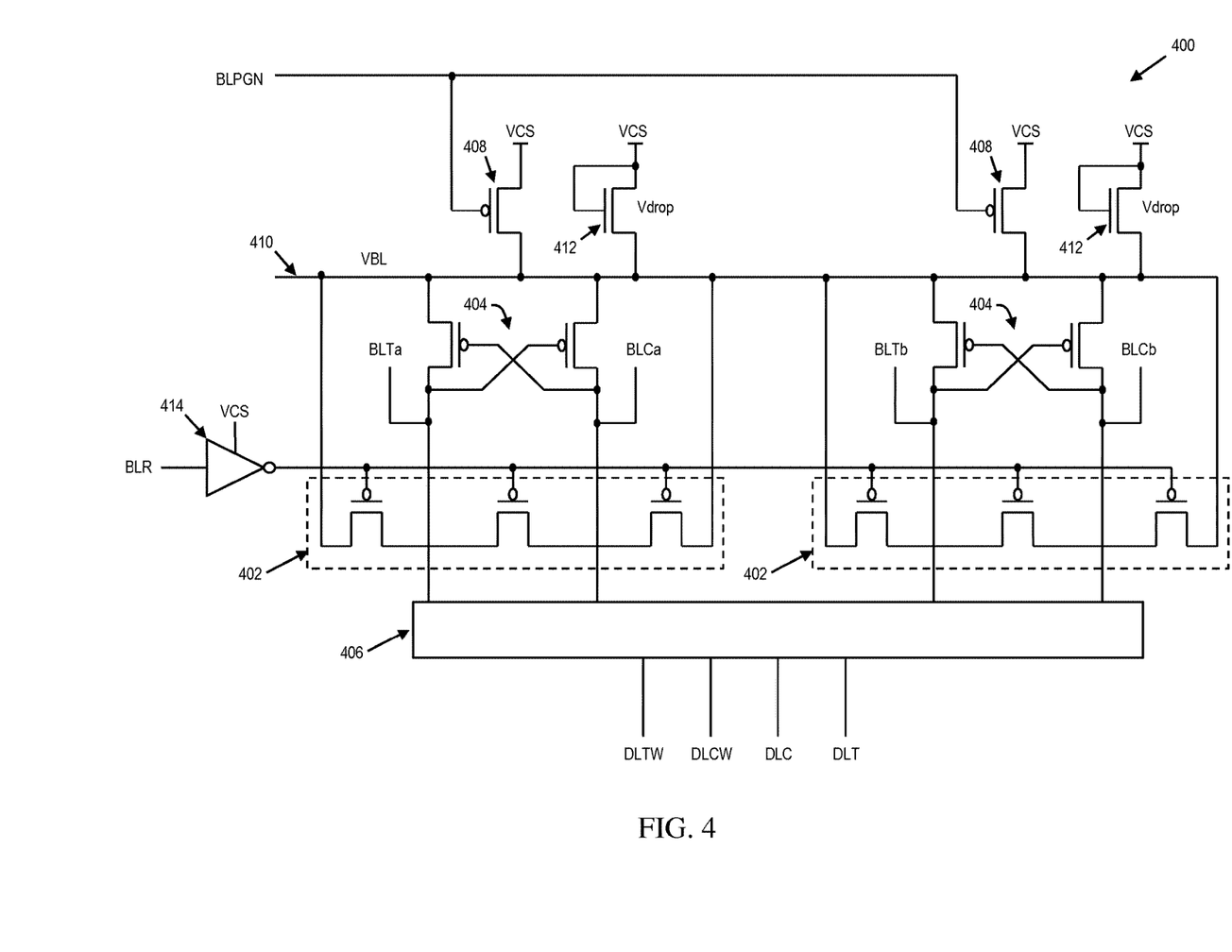
FIG. 4 shows an embodiment of a circuit in accordance with aspects of the invention.

FIG. 4 shows an embodiment of a circuit 400 for improving SRAM stability in accordance with aspects of the invention. The circuit 400 may be contained wholly or partly in a bitline control such as bitline control 315 described with respect to FIG. 3. In the exemplary embodiment depicted, only two bit line pairs are illustrated for purposes of simplicity, and thus it will be understood that several additional bit lines are contemplated in a functional SRAM array. The bit line pairs (true and complement) shown in FIG. 4 are labeled as BLTa, BLCa and BLTb, BLCb. Each bit line pair includes a trio of precharge PFETs (collectively designated by 402) that are controlled through control signal BLR, as well as a pair of cross-coupled PFETs (collectively designated by 404) that serve to reinforce the precharged level of one of the bit lines in a bit line pair during any operation.

As further shown in FIG. 4, each bit line pair is connected to bit switch circuitry 406 that contains bit switches for each respective bit line pair to enable writing and reading of individual SRAM cells connected to the bit line pair. The write data to be written to selected SRAM cells is introduced through complementary write data line pairs DLTW, DLCW in the exemplary embodiment depicted. The bit switch circuitry 406 may also be connected to sense amplifier data lines DLC, DLT.

Still referring to FIG. 4, VBL represents the bitline precharge voltage on precharge line 410. According to aspects of the invention, the circuit 400 is configured to cause VBL to be a first voltage potential immediately prior to a non-read operation and a second voltage potential immediately prior to a read operation of the selected SRAM cell. In this manner, implementations of the invention precharge the bitlines to different levels depending on whether a read or non-read operation follows. In embodiments, at least one header switch 408 is connected between the high voltage supply level, e.g., VCS, and the VBL line 410. The header switch 408 may comprise, for example, a PFET that is controlled (selectively turned ON/OFF) by control signal BLPGN.

According to aspects of the invention, the circuit 400 also includes a device 412 that is connected between VCS and the VBL line 410 and that defines a voltage drop Vdrop. In embodiments, the device 412 is a diode connected NFET, although any suitable voltage drop device may be used. The device 412 may be configured to provide any desired value of Vdrop. In an exemplary embodiment, VCS is about 680 mV and Vdrop is about 120 mV, although other values of VCS and Vdrop may be used with aspects described herein.

Still referring to FIG. 4, the control signal BLR is used to selectively control the precharge state of the bitlines, e.g., turn the precharging ON and OFF at selected times. An inverter 414 is connected between the BLR signal line and the gates of the precharge PFETs 402, such that BLR being at a high state turns on bitline precharging and BLR being at a low state turns OFF bitline precharging. During precharging (e.g., when the BLR signal turns on the precharge PFETs 402), the bitline precharge voltage VBL is always influenced by VCS through device 412. When the BLPGN signal turns off the header switch 408, the bitlines are precharged to VBL=VCS-Vdrop. Conversely, when the BLPGN signal turns on the header switch 408, the bitlines are precharged to VBL=VCS.

According to aspects of the invention, the control signal BLPGN is controlled such that it turns off the header switch 408 during a precharge that immediately precedes a non-read operation of a selected SRAM cell, and turns on the header switch 408 during a precharge that immediately precedes a read operation of a selected SRAM cell. In this manner, the bitlines are precharged to a first level (e.g., VBL=VCS-Vdrop) prior to a non-read operation, and to a second level (VBL=VCS) prior to a read operation. In embodiments, the control signal BLPGN is set to turn off the header switch 408 before the end of the read cycle and prior to the bitline precharge for a subsequent non-read cycle. The control signal BLPGN may be controlled (e.g., set high or low) by the precharge control 320 described with respect to FIG. 3. In the circuit 400, all the bitlines of the array are precharged to the same precharge voltage VBL, either VCS or VCS-Vdrop based on whether a read or non-read operation is being performed. A typical read or write operation may immediately follow the precharging, e.g., similar to the manner described with respect to FIGS. 1 and 2.

Still referring to FIG. 4, in embodiments the inverter 414 associated with the precharge control signal BLR is driven by VCS instead of VBL. As described herein, VBL is reduced at certain times to a level lower than VCS (e.g., VCS minus Vdrop) which would result in reduced drive on the inverter 414 if VBL were used to drive the inverter 414. Accordingly, the inverter 414 may be connected directly to VCS instead of VBL.

The circuit 400 as described herein improves the stability of the half selected cells of the SRAM array during write operations by using a relatively lower bitline precharge voltage (e.g., VCS-Vdrop) for the write operations. In turn, the writeability may be improved by reducing the amount of stability assist used during the write operation. Stated differently, the stability improvement provided by implementations of the invention permits a design to lessen or outright avoid the amount of stability assist (i.e., lowering the wordline potential during a write) thereby improving the writeability by employing a higher wordline potential during a write. The improved writeability enables a reduction of the write wordline pulse and, thus, improves speed of the SRAM array. The improved stability margins may be used to tune the bitcell for a desired writeability, thereby providing the potential to reduce the bitcell size. Although described with respect to an array of 6T SRAM cells, the circuit 400 may be implemented for use with an array of 8T SRAM cells and multi-port memories.

Figure 5:
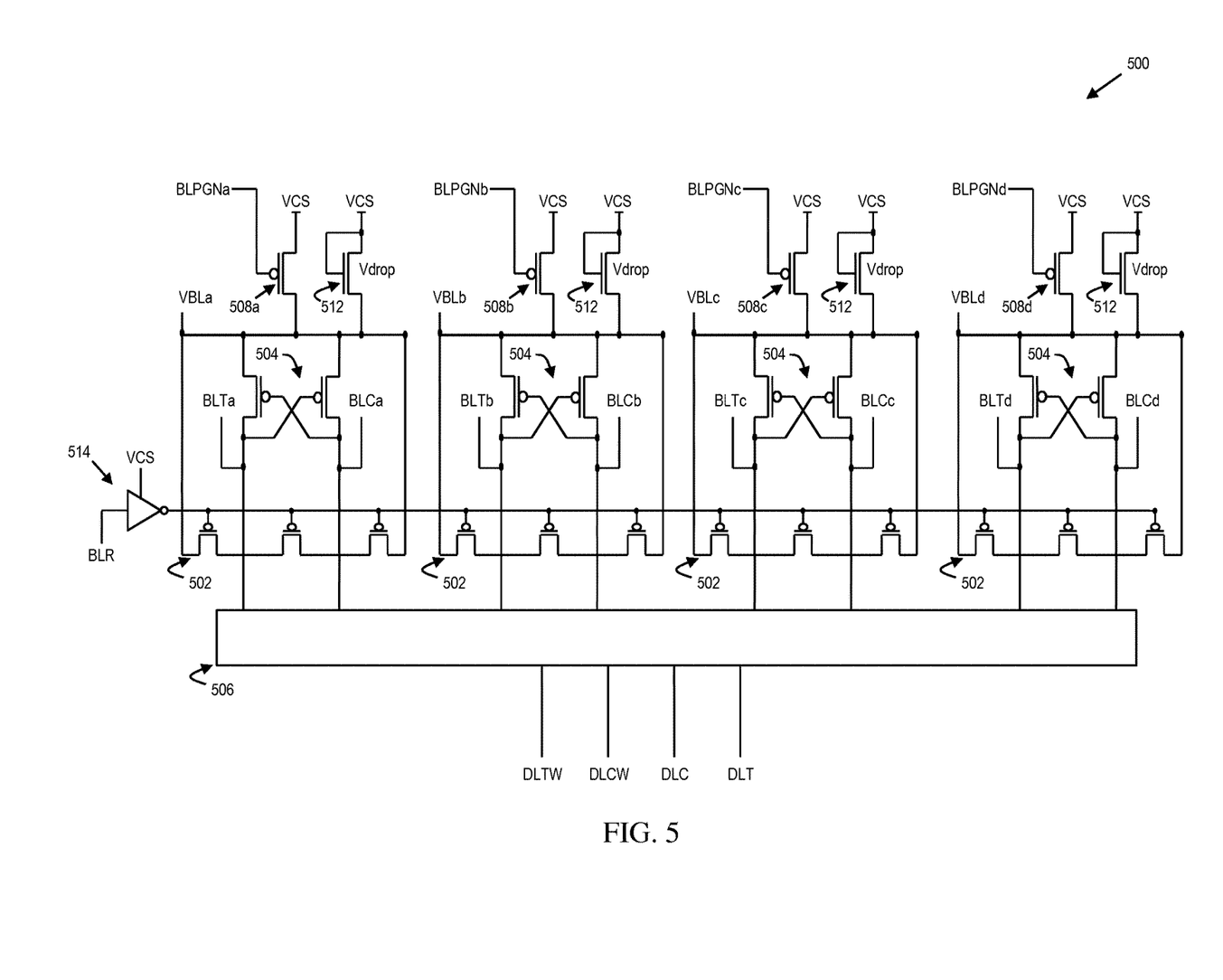
FIG. 5 shows another embodiment of a circuit in accordance with aspects of the invention.

FIG. 5 shows another embodiment of a circuit 500 for improving SRAM stability in accordance with aspects of the invention. The circuit 500 may be contained wholly or partly in a bitline control such as bitline control 315 described with respect to FIG. 3. In the exemplary embodiment depicted, four bit line pairs are illustrated for purposes of simplicity, and thus it will be understood that several additional bit lines are contemplated in a functional SRAM array. The bit line pairs (true and complement) shown in FIG. 5 are labeled as BLTa/BLCa, BLTb/BLCb, BLTc/BLCc, and BLTd/BLCd. Each bit line pair includes a trio of precharge PFETs (collectively designated by 502) that are controlled through control signal BLR, as well as a pair of cross-coupled PFETs (collectively designated by 504) that serve to reinforce the precharged level of one of the bit lines in a bit line pair during any operation. The precharge PFETs 502 and cross-coupled PFETs 504 may be similar to elements 402 and 404, respectively.

As further shown in FIG. 5, each bit line pair is connected to bit switch circuitry 506 that contains bit switches for each respective bit line pair to enable writing and reading of individual SRAM cells connected to the bit line pair. The write data to be written to selected SRAM cells is introduced through complementary write data line pairs DLTW, DLCW in the exemplary embodiment depicted. The bit switch circuitry 506 may also be connected to sense amplifier data lines DLC, DLT.

According to aspects of the invention, the circuit 500 is configured to control the bitline precharge voltage of each bitline pair independently, as opposed to the circuit 400 of FIG. 4 in which a common bitline precharge voltage is used for all the bitline pairs at any given time. In this embodiment, each bitline pair has its own header switch that is controlled by a respective control signal to provide a respective bitline precharge voltage. For example, the bitline pair BLTa/BLCa has an associated respective bitline precharge voltage VBLa that is set to VBLa=VCS when the control signal BLPGNa turns on the header switch 508a, and that is set to VBLa=VCS-Vdrop when the control signal BLPGNa turns off the header switch 508a. Similarly, the bitline pair BLTb/BLCb has an associated respective bitline precharge voltage VBLb that is set to VBLb=VCS when the control signal BLPGNb turns on the header switch 508*b*, and that is set to VBLb=VCS-Vdrop when the control signal BLPGNb turns off the header switch 508*b*. Similarly, the bitline pair BLTc/BLCc has an associated respective bitline precharge voltage VBLc that is set to VBLc=VCS when the control signal BLPGNc turns on the header switch 508*c*, and that is set to VBLc=VCS-Vdrop when the control signal BLPGNc turns off the header switch 508*c*. Similarly, the bitline pair BLTd/BLCd has an associated respective bitline precharge voltage VBLd that is set to VBLd=VCS when the control signal BLPGNd turns on the header switch 508*d*, and that is set to VBLd=VCS-Vdrop when the control signal BLPGNd turns off the header switch 508*d*.

In this embodiment, each of the respective control signals BLPGNa, BLPGNb, BLPGNc, BLPGNd is individually controlled (e.g., by precharge control 320 of FIG. 3), such that the bitline precharge voltages VBLa, VBLb, VBLc, VBLd may be controlled independently of one another. In this manner, each bitline pair is arranged on a respective bitline power gating island. In this embodiment, immediately prior to a read of a selected cell in an accessed column, the control signals BLPGNa-d are set such that the bitlines of the accessed column are precharged to the higher potential (VCS), and the bitlines of the half-selected columns are precharged to the lower potential (VCS-Vdrop). This improves the stability of the cells of the half-selected columns during the read of the selected cell in the accessed column. Moreover, immediately prior to a non-read operation to a selected cell in an accessed column, the control signals BLPGNa-d are set such that the bitlines of all the columns are precharged to the lower potential (VCS-Vdrop). This improves the stability of the cells of the half-selected columns during the write of the selected cell in the accessed column. In this manner, the circuit 500 may be used to improve stability of cells in half-selected columns for both reads and writes.

Still referring to FIG. 5, each of the header switches 508*a-d* may be similar to header switch 408 described with respect to FIG. 4. Also, each of the devices 512 may define a voltage drop Vdrop in a manner similar to device 412 described with respect to FIG. 4. Further, the inverter 514 may be similar to inverter 414 described with respect to FIG. 4, e.g., driven by VCS. A typical read or write operation may immediately follow the precharging, e.g., similar to the manner described with respect to FIGS. 1 and 2. Although described with respect to an array of 6T SRAM cells, the circuit 500 may be implemented for use with an array of 8T SRAM cells and multi-port memories.

The structures (e.g., circuits) of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   precharging bitline pairs of a Static Random Access Memory (SRAM) array to a first voltage potential for a non-read operation;
   precharging only a single one of the bitline pairs to a second voltage potential for a read operation, wherein the first voltage potential is less than the second voltage potential, and wherein the single one of the bitline pairs corresponds to a column that contains a selected cell of the read operation; and
   precharging all other ones of the bitlines pairs, exclusive of the single one of the bitline pairs, to the first voltage potential for the read operation.

2. The method of claim 1, wherein the bitline pairs are precharged by a charging circuit comprising:
   a header switch connected between a high voltage supply level and a precharge line; and
   a voltage drop device connected between the high voltage supply level and the precharge line.

3. The method of claim 2, wherein:
   the header switch is selectively turned on and off by a control signal applied to a gate of the header switch;
   the precharge line is configured to be charged to the first voltage potential when the header switch is off; and
   the precharge line is configured to be charged to the second voltage potential when the header switch is on.

* * * * *